US012567563B2

(12) United States Patent
    Itoh et al.

(10) Patent No.:  US 12,567,563 B2
(45) Date of Patent:       Mar. 3, 2026

(54) PLASMA PROCESSING APPARATUS AND PLASMA PROCESSING METHOD

(71) Applicant: TOKYO ELECTRON LIMITED, Tokyo (JP)

(72) Inventors: Satoshi Itoh, Yamanashi (JP); Hiroyuki Ikuta, Yamanashi (JP); Yoshiyuki Kondo, Yamanashi (JP); Hideki Yuasa, Yamanashi (JP); Soudai Emori, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 787 days.

(21) Appl. No.: 17/388,613

(22) Filed: Jul. 29, 2021

(65) Prior Publication Data

US 2022/0037124 A1      Feb. 3, 2022

(30) Foreign Application Priority Data

Jul. 31, 2020    (JP) ................................. 2020-130808

(51) Int. Cl.
| | |
|---|---|
| *H01L 21/02* | (2006.01) |
| *C23C 16/509* | (2006.01) |
| *C23C 16/511* | (2006.01) |
| *H01J 37/32* | (2006.01) |
| *C23C 16/34* | (2006.01) |

(52) U.S. Cl.
CPC ...... *H01J 37/32311* (2013.01); *C23C 16/509* (2013.01); *C23C 16/511* (2013.01); *H01J 37/32174* (2013.01); *H01L 21/0217* (2013.01); *H01L 21/02274* (2013.01); *C23C 16/345* (2013.01)

(58) Field of Classification Search
CPC ............................ C23C 16/509; C23C 16/511
See application file for complete search history.

(56) References Cited

U.S. PATENT DOCUMENTS 5,968,379  A  *  10/1999  Zhao .................... C23C 16/4586
                                                                    219/121.52
6,320,154  B1      11/2001  Akahori et al.
                                    (Continued)

FOREIGN PATENT DOCUMENTS

JP        2013-161960 A        8/2013
JP        2013206784 A        10/2013
                        (Continued)

*Primary Examiner* — Dah-Wei D. Yuan
*Assistant Examiner* — Kristen A Dagenais
(74) *Attorney, Agent, or Firm* — Fenwick & West LLP

(57)              ABSTRACT

A plasma processing apparatus for generating plasma from a processing gas using microwaves and performing plasma processing on a substrate is provided. The apparatus includes a processing chamber having a substrate support on which the substrate is placed; a plurality of microwave radiation units arranged at a central portion and an outer peripheral portion of a ceiling wall of the processing chamber and configured to radiate microwaves; and a controller configured to complete microwave radiation from the microwave radiation unit in the central portion upon completion of plasma processing of the substrate and then complete microwave radiation from the microwave radiation units in the outer peripheral portion.

2 Claims, 9 Drawing Sheets

(56)  References Cited

U.S. PATENT DOCUMENTS

| 2006/0211246 A1 * | 9/2006 | Ishizaka ............ | C23C 16/45544 |
| | | | 257/E21.171 |
| 2012/0247676 A1 * | 10/2012 | Fujino ................ | H01J 37/32211 |
| | | | 118/723 MW |
| 2018/0374680 A1 * | 12/2018 | Ikeda ................ | H01L 21/67739 |

FOREIGN PATENT DOCUMENTS

| JP | 2020-065018 A | 4/2020 |
| KR | 10-1999-0077238 A | 10/1999 |
| KR | 10-2019-0001518 A | 1/2019 |

* cited by examiner

A: PRESENT EMBODIMENT
B: COMPARATIVE EXAMPLE

MICROWAVE

A

B

Time

PROCESS IS COMPLETED

PLASMA PROCESSING APPARATUS AND PLASMA PROCESSING METHOD

CROSS-REFERENCE TO RELATED APPLICATIONS

This application claims priority to Japanese Patent Application No. 2020-130808, filed on Jul. 31, 2020, the entire contents of which are incorporated herein by reference.

TECHNICAL FIELD

The present disclosure relates to a plasma processing apparatus and a plasma processing method.

BACKGROUND

For example, Japanese Patent Application Publication No. 2013-161960 discloses a plasma processing method for generating plasma in a processing chamber using microwaves, performing plasma processing on a substrate, and forming a thin film such as a silicon oxide film, a silicon nitride film, or the like on the substrate.

SUMMARY

The present disclosure provides a technique capable of reducing particles on a substrate.

In accordance with an aspect of the present disclosure, there is provided an plasma processing apparatus for generating plasma from a processing gas using microwaves and performing plasma processing on a substrate, the apparatus including: a processing chamber having a substrate support on which the substrate is placed; a plurality of microwave radiation units arranged at a central portion and an outer peripheral portion of a ceiling wall of the processing chamber and configured to radiate microwaves; and a controller configured to complete microwave radiation from the microwave radiation unit in the central portion upon completion of plasma processing of the substrate and then complete microwave radiation from the microwave radiation units in the outer peripheral portion.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
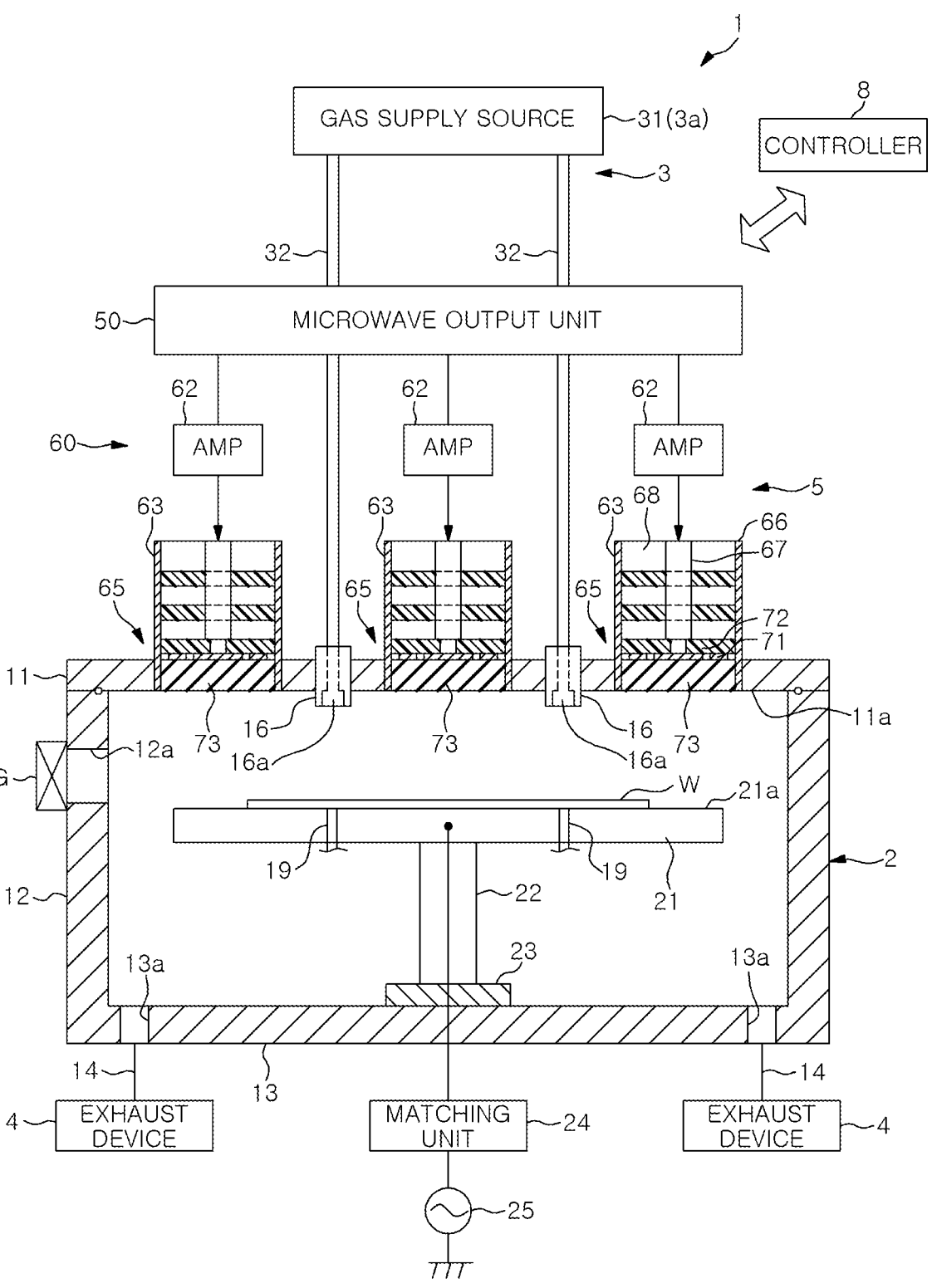
FIG. 1 is a schematic cross-sectional view showing an example of a plasma processing apparatus according to an embodiment.

Hereinafter, embodiments of the present disclosure will be described in detail with reference to the accompanying drawings. Like reference numerals will be given to like parts throughout the drawings, and redundant description thereof may be omitted.

Plasma Processing Apparatus

A plasma processing apparatus 1 according to an embodiment will be described with reference to FIG. 1. FIG. 1 is a schematic cross-sectional view showing an example of the plasma processing apparatus 1 according to an embodiment. The plasma processing apparatus 1 according to the embodiment is an example of a chemical vapor deposition (CVD) film forming apparatus, and is a microwave plasma processing apparatus for generating plasma from a processing gas using microwaves and performing plasma processing on a substrate.

The plasma processing apparatus 1 includes a processing chamber 2, a substrate support 21, a gas supply mechanism 3, an exhaust device 4, a microwave introducing module 5, and a controller 8. The processing chamber 2 accommodates a substrate W, e.g., a wafer. The substrate support 21 is disposed in the processing chamber 2 and has a placement surface 21a on which the substrate W is placed. The gas supply mechanism 3 supplies a gas into the processing chamber 2. The exhaust device 4 exhausts the inside of the processing chamber 2 so that the inside of the processing chamber 2 can be depressurized. The microwave introducing module 5 introduces microwaves for converting a processing gas supplied into the processing chamber 2 into plasma. The controller 8 controls individual components of the plasma processing apparatus 1.

The processing chamber 2 has, e.g., a cylindrical shape. The processing chamber 2 is made of a metal material such as aluminum, an alloy thereof, or the like. The microwave introducing module 5 is disposed at an upper portion of the processing chamber 2 and serves as a plasma generation unit that introduces electromagnetic waves (microwaves in the present embodiment) into the processing chamber 2 and generates plasma.

The processing chamber 2 has a plate-shaped ceiling wall 11, a bottom wall 13, and a sidewall 12 that connects the ceiling wall 11 and the bottom wall 13. The ceiling wall 11 has a plurality of openings. The sidewall 12 has a loading/unloading port 12a for loading/unloading the substrate W into/from a transport chamber (not shown) adjacent to the processing chamber 2. A gate valve G is disposed between the processing chamber 2 and the transport chamber (not shown). The gate valve G has a function of opening/closing the loading/unloading port 12a. When the gate valve G is closed, the gate valve G airtightly seals the processing chamber 2. When the gate valve G is opened, the gate valve G allows the substrate W to be transferred between the processing chamber 2 and the transport chamber.

The bottom wall 13 has a plurality of (two in FIG. 1) exhaust ports 13a. The plasma processing apparatus 1 further includes exhaust lines 14 that connect the exhaust ports 13a and the exhaust device 4. Each exhaust device 4 has an APC valve and a high-speed vacuum pump capable of rapidly decreasing a pressure in the processing chamber 2 to a predetermined degree of vacuum. The high-speed vacuum pump is, e.g., a turbo molecular pump or the like. By operating the high-speed vacuum pump of the exhaust device 4, the pressure in the inner space of the processing chamber 2 is decreased to the predetermined degree of vacuum.

The plasma processing apparatus 1 further includes a support member 22 for supporting the substrate support 21 in the processing chamber 2, and an insulating member 23 disposed between the support member 22 and the bottom wall 13. The substrate W is horizontally placed on the substrate support 21. When the substrate W is loaded/unloaded, the substrate W is raised by lift pins 19 and delivered between a transfer mechanism and the substrate support 21. The support member 22 has a cylindrical shape extending from the center of the bottom wall 13 toward the inner space of the processing chamber 2. The substrate support 21 and the support member 22 are made of, e.g., aluminum having an alumite-treated (anodically oxidized) surface, or the like.

The plasma processing apparatus 1 further includes a radio-frequency (RF) bias power supply 25 for supplying an RF power to the substrate support 21, and a matching unit 24 disposed between the substrate support 21 and the RF bias power supply 25. The RF bias power supply 25 applies an RF power to the substrate support 21 to attract ions to the substrate W. The matching unit 24 has a circuit for matching the output impedance of the RF bias power supply 25 and the impedance of a load side (the substrate support 21 side).

The plasma processing apparatus 1 may further include a temperature control mechanism (not shown) for heating or cooling the substrate support 21. The temperature control mechanism controls the temperature of the substrate W within a range of, e.g., 25° C. (room temperature) to 900° C.

The plasma processing apparatus 1 further includes a plurality of gas nozzles 16. Each gas nozzles 16 has a cylindrical shape and protrudes vertically from the bottom surface of the ceiling wall 11. Each gas nozzles 16 supplies the processing gas into the processing chamber 2 from a gas supply hole 16a formed at the tip end thereof. The gas nozzles 16 may be disposed on the sidewall 12.

The protrusion lengths of the gas nozzles 16 from the bottom surface of the ceiling wall 11 may be different with each other. A gas supply source 31 is used as a gas supply source for a noble gas for plasma generation or processing gases used in film formation, for example. For example, in the case of forming a silicon nitride film, silane gas (SiH$_4$) whose decomposition needs to be suppressed among the processing gases, is introduced from the gas supply hole 16a distant from the bottom surface of the ceiling wall 11 (In other words, in this case, the gas nozzle 16 protrudes further from the bottom surface of the ceiling wall 11). N$_2$ gas and/or a noble gas such as Ar or the like is introduced from the gas supply hole 16a close to the bottom surface of the ceiling wall 11 (In other words, in this case, the gas nozzle 16 protrudes less from the bottom surface of the celling wall 11). Accordingly, excessive dissociation of the silane gas that is easily decomposed is prevented, which makes it possible to form a high-quality silicon nitride film.

The gas supply mechanism 3 has a gas supply device 3a including the gas supply source 31, and lines 32 that connect the gas supply source 31 and the gas nozzles 16. Although one gas supply source 31 is illustrated in FIG. 1, the gas supply device 3a may include multiple gas supply sources especially when different types of gases are to be used.

The gas supply device 3a further includes a mass flow controller and an on/off valve (both not shown) provided at the line 32. The types of gases to be supplied into the processing chamber 2, the flow rates of these gases, and the like are controlled by the mass flow controller and the on/off valve.

The individual components of the plasma processing apparatus 1 are connected to and controlled by the controller 8. The controller 8 may be a computer and may include a process controller having a CPU, a user interface connected to the process controller, and a storage unit.

The process controller is a control device for controlling each component of the plasma processing apparatus 1 that are related to process conditions such as a temperature, a pressure, a gas flow rate, an RF power for bias application, a microwave output, and the like. Examples of such components are the RF bias power supply 25, the gas supply device 3a, the exhaust device 4, the microwave introducing module 5, and the like.

The user interface has a keyboard or a touch panel that allows a process manager to input commands in order to manage the plasma processing apparatus 1, and a display for displaying an operation status of the plasma processing apparatus 1.

The storage unit stores control programs for realizing various processes executed by the plasma processing apparatus 1 under the control of the process controller, a recipe in which process condition data and the like are recorded, and the like. The process controller can read out and execute a control program or recipe from the storage unit, if necessary, in response to commands from the user interface. Accordingly, desired processing is performed in the processing chamber 2 of the plasma processing apparatus 1 under the control of the process controller.

The control program and the recipe may be stored in a computer-readable storage medium such as a flash memory, a DVD, or a Blu-ray disc, or the like. Further, the recipe may be available online by receiving it from another device at any time via, for example, a dedicated line.

The microwave introducing module 5 is disposed at the central portion and the outer peripheral portion of the ceiling wall 11 of the processing chamber 2, and includes an amplifier (AMP) 62 that amplifies and outputs microwaves and a plurality of microwave radiation units 63 for radiating microwaves output from the amplifier 62. The microwave radiation units 63 are arranged at the ceiling wall 11.

The microwave radiation unit 63 includes a tuner for matching an impedance, and an antenna unit 65 for radiating amplified microwaves into the processing chamber 2. Further, the microwave radiation unit 63 includes a main body 66 made of a metal material and having a cylindrical shape extending in a vertical direction, and an inner conductor 67 extending in the same direction as the extension direction of the main body 66 in the main body 66. The main body 66 and the inner conductor 67 form a coaxial tube. The main body 66 forms an outer conductor of the coaxial tube. The inner conductor 67 has a rod-shaped shape or a tubular shape. The space between an inner peripheral surface of the main body 66 and an outer peripheral surface of the inner conductor 67 forms a microwave transmission path 68.

The antenna unit 65 includes a planar antenna 71 connected to the lower end of the inner conductor 67, a microwave retarder 72 disposed on the upper surface side of the planar antenna 71, and a microwave transmission plate 73 disposed on the bottom surface side of the planar antenna 71. The bottom surface of the microwave transmission plate 73 is exposed to the inner space of the processing chamber 2. The microwave transmission plate 73 is fitted into an opening of the ceiling wall 11 via the main body 66. The microwave transmission plate 73 serves as a window that transmits microwaves.

The planar antenna 71 may have a disc shape. Further, the planar antenna 71 has a slot penetrating through the planar antenna 71. The microwave retarder 72 is made of a material having a dielectric constant greater than that of a vacuum. The microwave retarder 72 may be made of, e.g., quartz, ceramic, a fluorine-based resin such as polytetrafluoroethylene resin or the like, or a polyimide resin. The wavelength of the microwave increases in the vacuum. The microwave retarder 72 has a function of adjusting plasma by shortening the wavelength of the microwave. Further, the phase of the microwave changes depending on the thickness of the microwave retarder 72. Therefore, by adjusting the phase of the microwave by changing the thickness of the microwave retarder 72, the planar antenna 71 can be adjusted to be at the antinode position of the standing wave. Accordingly, the power of microwaves can be efficiently introduced into the processing chamber 2.

The microwave transmission plate 73 is made of a dielectric material. The dielectric material forming the microwave transmission plate 73 may be, e.g., quartz, ceramic, or the like. The microwave transmission plate 73 has a shape that allows the microwaves to be effectively radiated in a TE mode.

Figure 2:
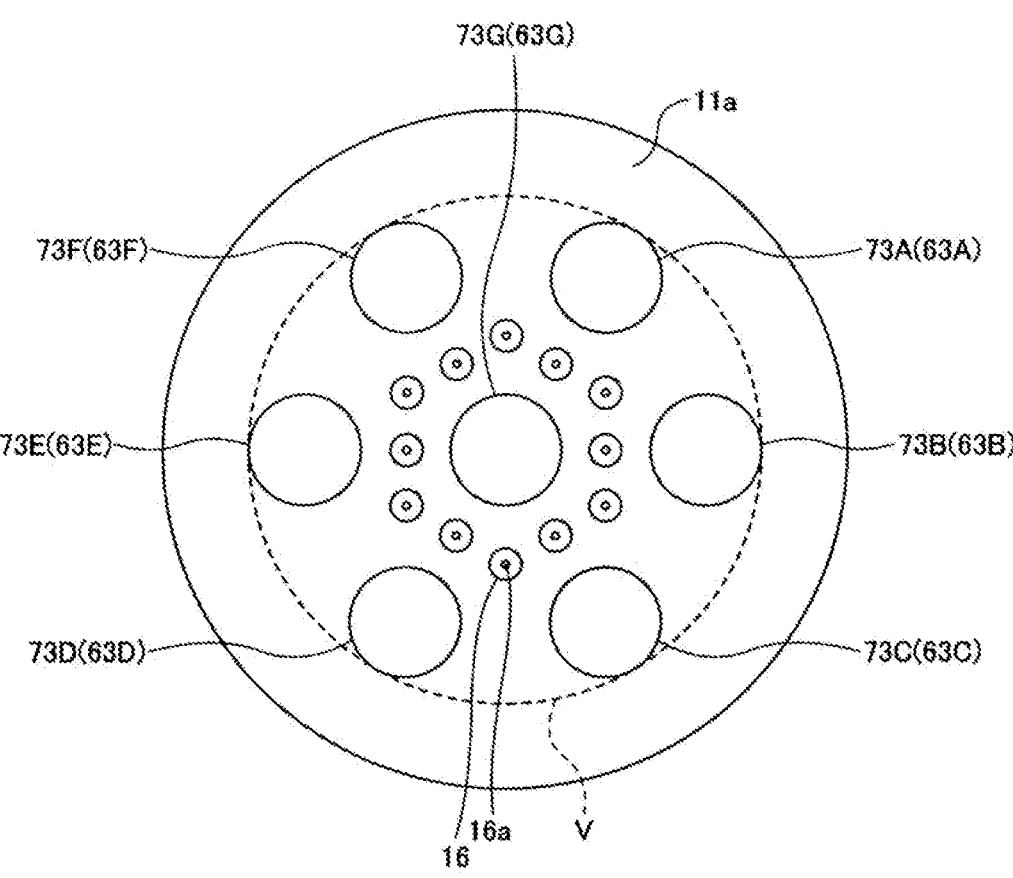
FIG. 2 shows an example of a bottom surface of a ceiling wall of a processing chamber according to an embodiment.

Next, the bottom surface of the ceiling wall 11 of the processing chamber 2 shown in FIG. 1 will be described with reference to FIG. 2. FIG. 2 shows an example of the bottom surface 11a of the ceiling wall 11 of the processing chamber 2 according to an embodiment.

The microwave radiation units 63 include seven microwave radiation units 63A to 63G. The microwave radiation units 63A to 63G are collectively referred to as the microwave radiation unit 63. The diameter of a virtual circle V that connects outer edges of the microwave radiation units 63A to 63F arranged on the outer peripheral portion among the microwave radiation unit 63 is greater than the diameter of the substrate support 21.

A plurality of microwave transmission plates 73 are provided in each of the microwave radiation units 63A to 63G as microwave transmission plates 73A to 73G. The microwave transmission plate 73G is disposed at the central portion of the bottom surface 11a of the ceiling wall 11, and the microwave transmission plates 73A to 73F are disposed at the outer side of the microwave transmission plate 73G. The microwave transmission plate 73 has a cylindrical shape.

In all the microwave transmission plates 73, the distances between the center points of any three microwave transmission plates 73 adjacent to each other are the same. The gas nozzles 16 are arranged at equal intervals in a circumferential direction between the outer microwave transmission plates 73A to 73G and the central microwave transmission plate 73G.

FIGS. 1 and 2 illustrate an example in which the microwave radiation units 63 (the microwave transmission plates 73) are arranged at the central portion and also at the outer peripheral portion of the bottom surface 11a. However, the present disclosure is not limited thereto, and the microwave radiation units 63 may be arranged only at the outer peripheral portion without being arranged at the central portion of the bottom surface 11a as long as the multiple microwave radiation units 63 are provided.

Next, an example of particle generation in a conventional process will be described with reference to FIGS. 3A to 3D. FIGS. 3A to 3D explains generation of particles in the conventional process.

Figures 3A, 3B, 3C, 3D:
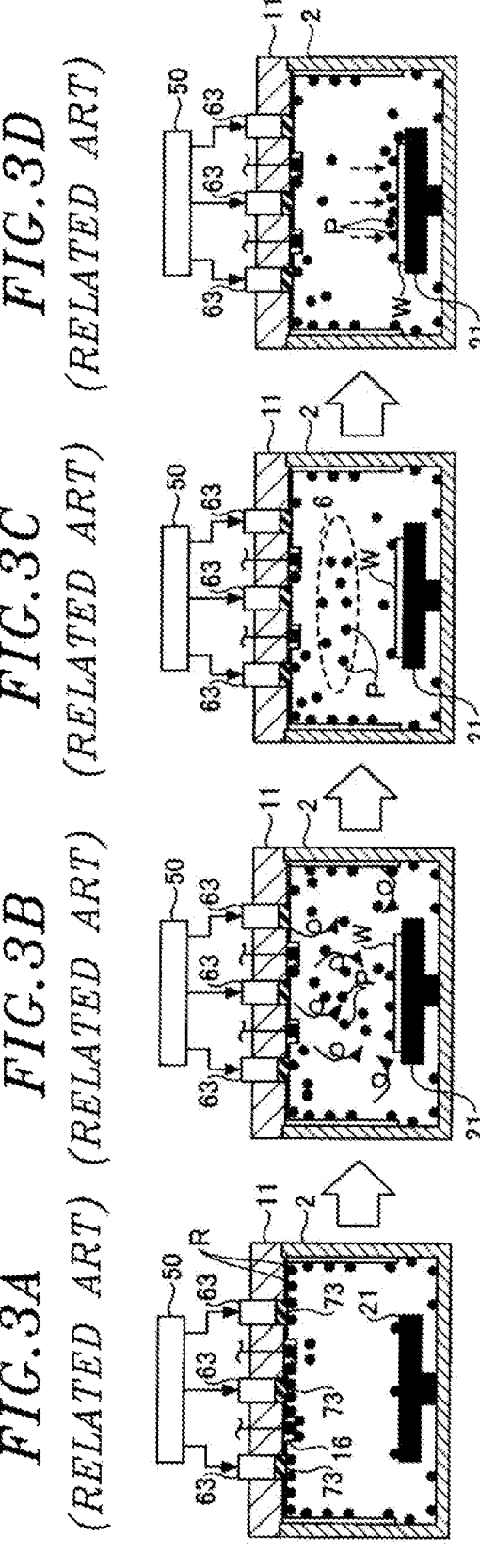
FIGS. 3A to 3D explain generation of particles in a conventional process.

When the plasma processing of the substrate W is performed by the plasma processing apparatus 1, a reaction product formed during the plasma processing is adhered to an inner wall of the processing chamber 2 and the substrate support 21 and gradually deposited thereto to form particles R, as shown in FIG. 3A.

In the plasma processing, as shown in FIG. 3B, when an unprocessed substrate W is placed on the substrate support 21, a pre-heating process of heating the substrate W to a predetermined temperature is performed. In the pre-heating process, in consideration of the thermal conductivity to the substrate W, the substrate W is heated in a state where the pressure in the processing chamber 2 is increased to, e.g., 333 Pa, and, then, the pressure is decreased to about 20 Pa. At this time, due to the change of the pressure in the processing chamber 2, the deposits R adhered to the inner wall of the processing chamber 2 are peeled-off and become particles P floating in the processing chamber 2.

In the film formation performed after the pre-heating process, the processing gases supplied from the gas nozzles 16 are turned into plasma by the microwaves radiated from the seven microwave radiation units 63. As shown in FIG. 3C, the substrate W is processed by the generated plasma 6. At this time, the particles P are captured by the plasma 6. Since the plasma 6 disappears when the film formation is completed and the microwave radiation is stopped, the particles P captured by the plasma 6 are deposited on the substrate W as shown in FIG. 3D.

Therefore, in the following description, A plasma processing method for reducing particles on the substrate W without affecting a film quality will be described in the order of a plasma processing method MT1 according to a first embodiment, a plasma processing method MT2 according to a second embodiment, and a plasma processing method MT3 according to a third embodiment.

First Embodiment

Figure 4:
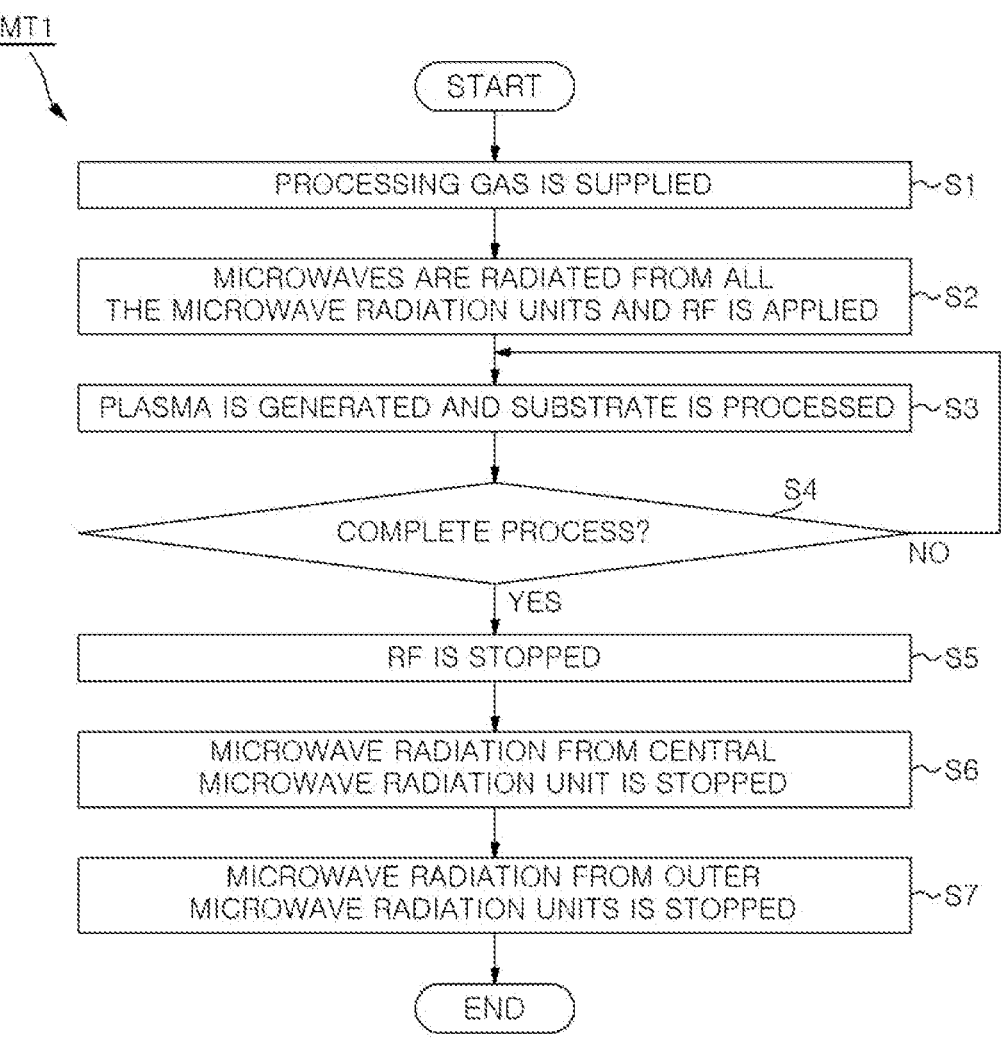
FIG. 4 shows an example of a plasma processing method according to a first embodiment.
Figure 5:
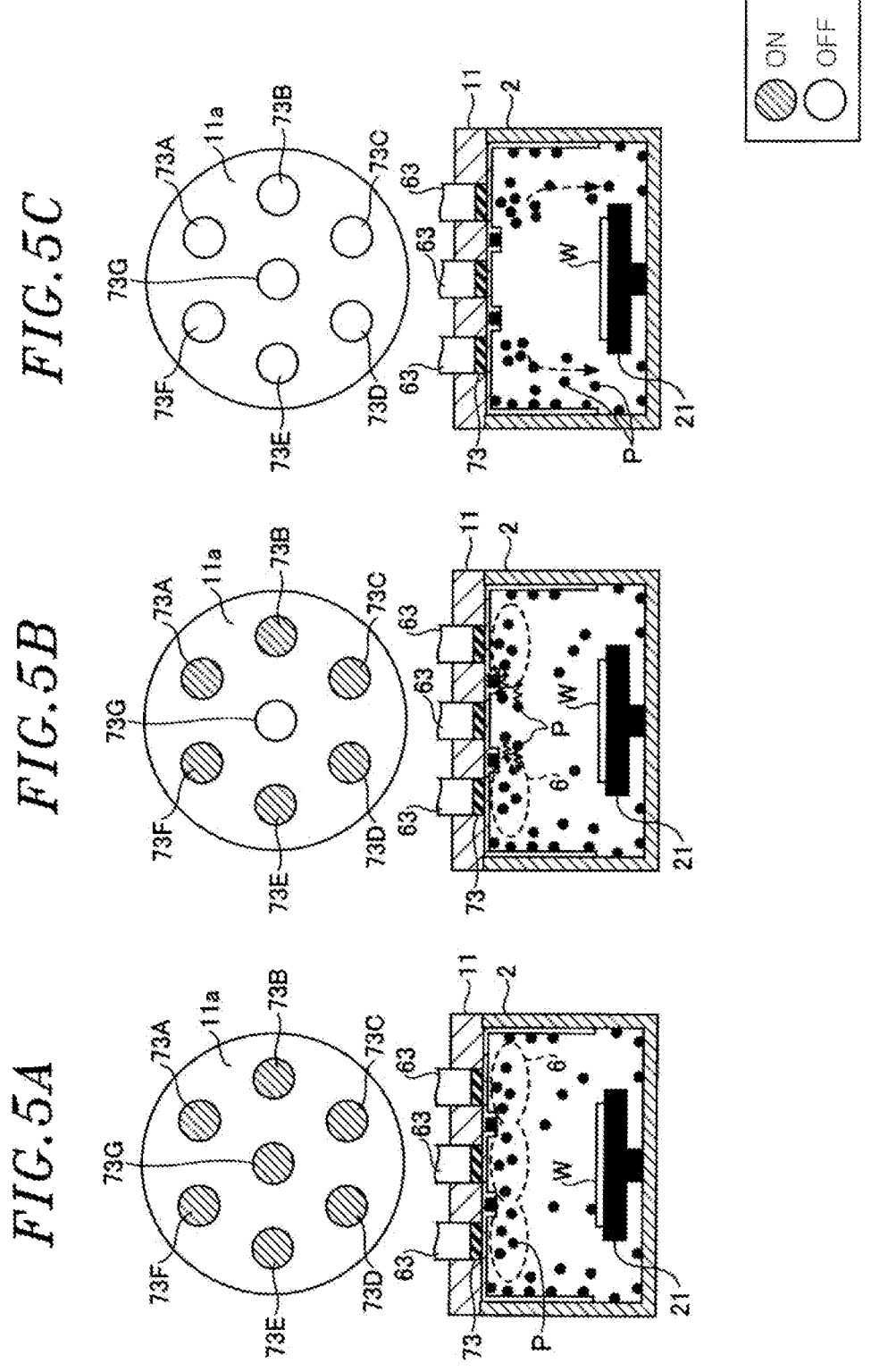
FIGS. 5A to 5C explain a plasma processing method according to the first embodiment.
Figure 6:
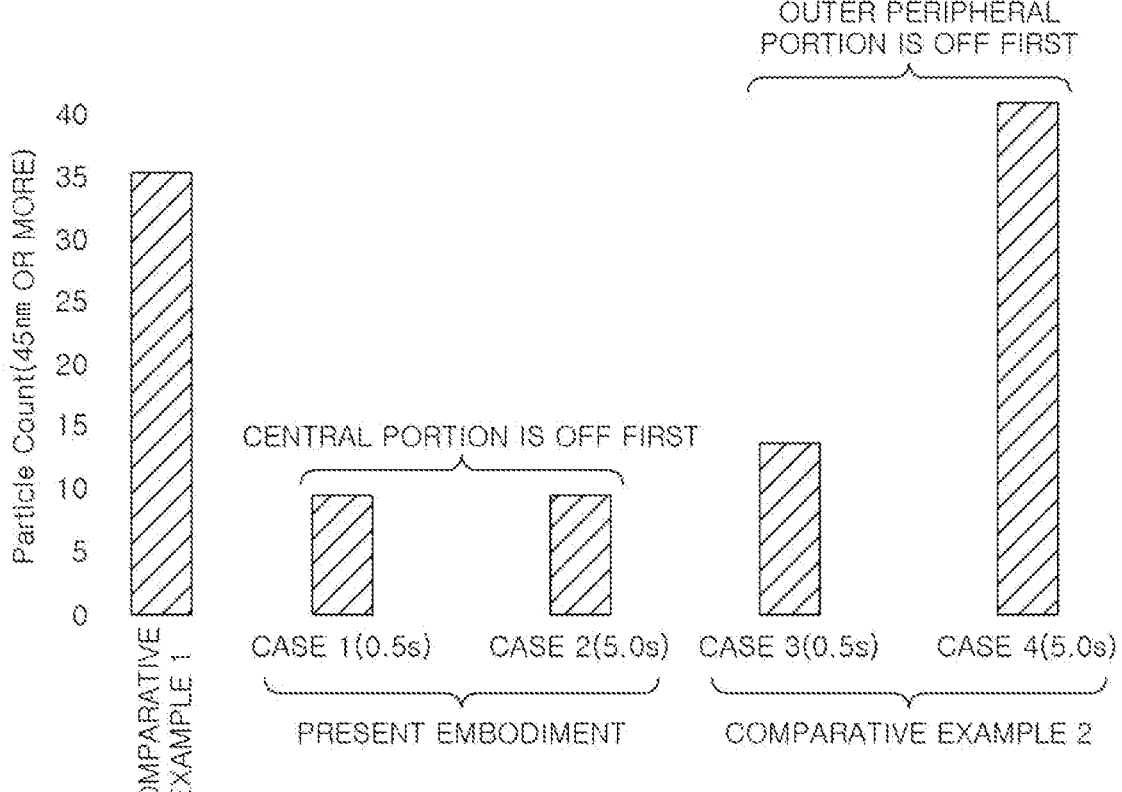
FIG. 6 shows an example of the effect of the plasma processing method according to the first embodiment.

First, the plasma processing method MT1 according to the first embodiment will be described with reference to FIGS. 4 to 6. FIG. 4 shows an example of the plasma processing method MT1 according to the first embodiment. FIGS. 5A to 5C explain the plasma processing method MT1 according to the first embodiment. FIG. 6 shows an example of the effect of the plasma processing method MT1 according to the first embodiment. The plasma processing method MT1 is performed by the plasma processing apparatus 1 under the control of the controller 8. Before the plasma processing method MT1 is performed, the substrate W is placed on the substrate support 21 and the pre-heating process is performed.

When the plasma processing method is started, the processing gas is supplied from the gas nozzles 16 (step S1). Next, the microwaves are radiated from the microwave radiation units 63A to 63G, and the RF power for bias voltage is applied from the RF bias power supply 25 (step S2). When it is not necessary to attract ions in the plasma toward the substrate W during the film formation, the application of the RF power for the bias voltage may be omitted. The plasma is generated from the processing gas by the microwave radiation, and the plasma processing of the substrate W is performed (step S3). In the steps S1 to S3, as shown in FIG. 5A, the microwaves are radiated from the microwave transmission plates 73A to 73G of all the microwave radiation units 63A to 63G. Accordingly, the plasma 6 is generated below the microwave transmission plates 73A to 73G and used for performing the plasma processing (film formation) on the substrate W. At this time, the particles P having electric charges are captured by an electrostatic force of the plasma 6.

Next, it is determined whether or not the film formation is completed (step S4). If it is determined that the film formation is not completed, the steps S3 and S4 are repeated to continue the film formation. When it is determined that the film formation is completed, the application of the RF power for the bias voltage from the RF bias power supply 25 is stopped (step S5). When the application of the RF power in the step S2 is omitted, the step S5 is omitted.

Next, the microwave radiation from the central microwave radiation unit 63G is stopped (step S6). Therefore, as shown in FIG. 5B, the microwave radiation from the central microwave transmission plate 73G is stopped while the microwaves are still radiated from the outer peripheral microwave transmission plates 73A to 73F. Accordingly, the plasma 6 below the microwave transmission plate 73G disappears, and the generation of the plasma 6 below the outer peripheral microwave transmission plates 73A to 73F is continued.

In this state, since the particles P have electric charges, the particles P captured by the plasma 6 in the central region move toward the plasma 6 in the outer region by the electrostatic force as the plasma 6 in the central region disappears.

Next, the microwave radiation from the outer microwave radiation units 63A to 63F is stopped (step S7). Therefore, as shown in FIG. 5C, the microwave radiation from the microwave transmission plates 73A to 73G of all the microwave radiation units 63A to 63G is stopped, and the plasma 6 below the microwave transmission plates 73A to 73F arranged at the outer peripheral portion of the bottom surface 11a also disappears.

The diameter of the virtual circle V (see FIG. 2) that connects the outer edges of the microwave radiation units 63A to 63F arranged on the outer peripheral portion is greater than the diameter of the substrate support 21. Therefore, the particles P captured by the plasma 6 above the outer peripheral portion of the substrate fall from the outer side of the substrate W toward the exhaust port 13a as shown in FIG. 5C as the plasma 6 in the outer region disappears and are exhausted by the exhaust device 4. Accordingly, the falling of the particles P onto the substrate W is suppressed, which makes it possible to reduce the number of the particles P on the substrate W.

FIG. 6 shows an example of the effect of the plasma processing method MT1 according to the first embodiment. FIG. 6 shows the result of counting the number of particles P having a size greater than 45 nm on the substrate W after the plasma processing method MT1 is performed.

A comparative example 1 of FIG. 6 shows the result of counting the number of particles P on the substrate W in the case of simultaneously completing the microwave radiation from the microwave radiation units 63A to 63G upon completion of the film formation.

The case where the microwave radiation at the central portion is off first ("center off first" in FIG. 6) of the present embodiment of FIG. 6 shows the number of particles P in the case of completing the microwave radiation from the central microwave radiation unit 63G and then completing the microwave radiation from the outer microwave radiation units 63A to 63F.

The case where the microwave radiation at the outer peripheral portion is off first ("outer periphery off first" in FIG. 6) of a comparative example 2 of FIG. 6 shows the number of particles P in the case of completing the microwave radiation from the outer microwave radiation units 63A to 63F and then completing the microwave radiation from the central microwave radiation units 63G.

From the above, in the present embodiment, after 0.5 sec (case 1) or 5.0 sec (case 2) had passed after the completion of the microwave radiation from the central microwave radiation unit 63G, the microwave radiation from the outer microwave radiation units 63A to 63F was completed. Accordingly, when the microwave radiation at the central portion was off first, it was possible to reduce the number of particles P in both cases 1 and 2.

On the other hand, the number of particles P on the substrate W was increased in the comparative example 1, compared to the present embodiment. Further, in a comparative example 2, after 0.5 sec (case 3) and 5.0 sec (case 4) had passed after the completion of the microwave radiation from the outer microwave radiation units 63A to 63F, the microwave radiation from the central microwave radiation unit 63G was completed. Accordingly, when the microwave radiation at the outer peripheral portion was off first, the number of particles P was increased in both cases 3 and 4, compared to the present embodiment. It it presumed that since the microwave radiation at the outer peripheral portion was off first, the particles P captured by the plasma 6 in the outer region were concentrated on the plasma 6 in the central region so that the number of particles P on the substrate W was increased.

From the above, it is clear that in the plasma processing method MT1 according to the first embodiment, the number of particles on the substrate can be reduced.

Second Embodiment

Figure 7:
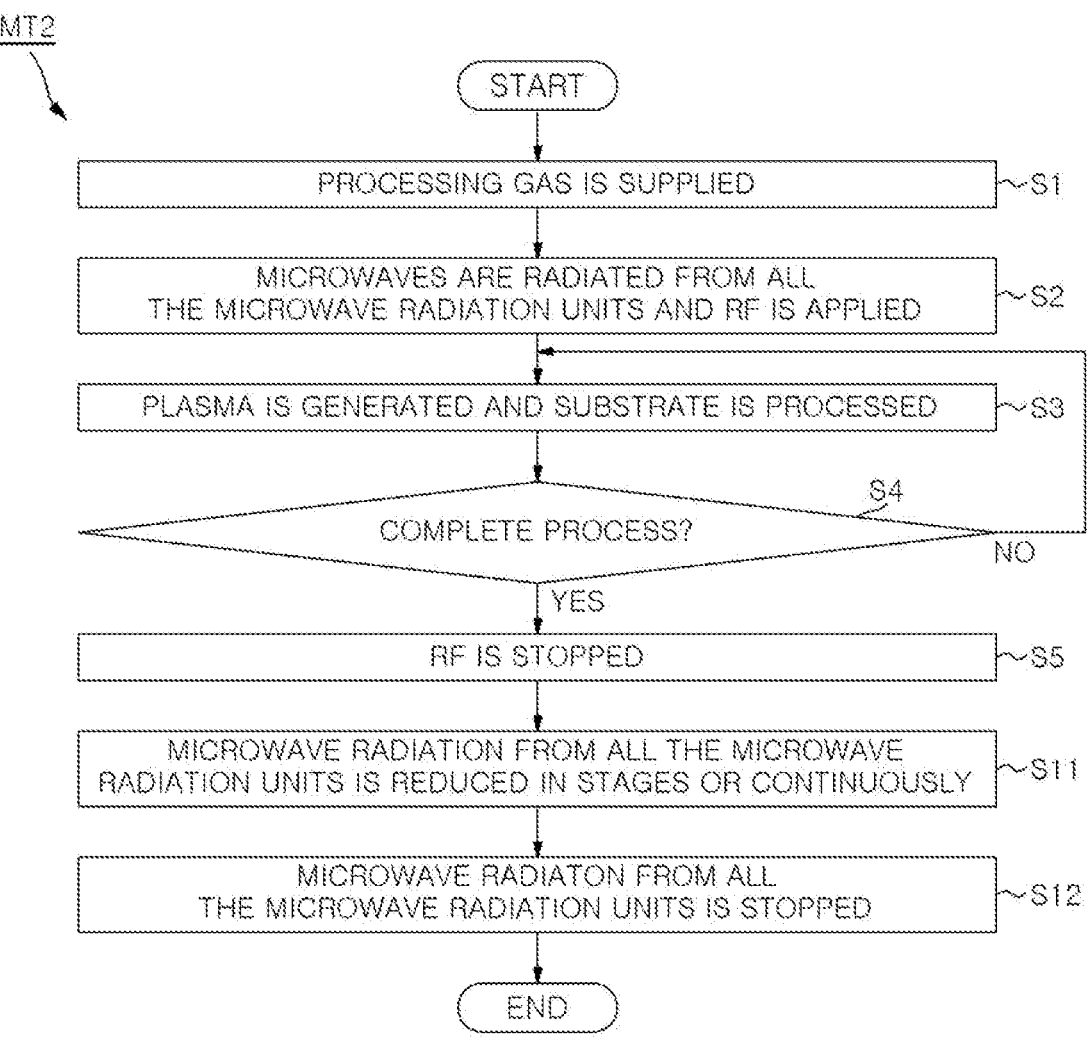
FIG. 7 shows an example of a plasma processing method according to a second embodiment.
Figure 8A:
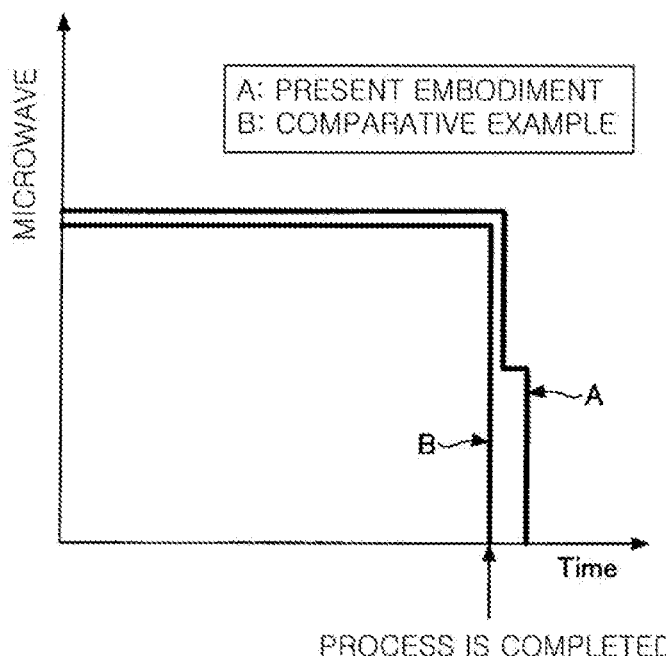
FIGS. 8A and 8B show an example of the effect of the plasma processing method according to the second embodiment.
Figure 8B:
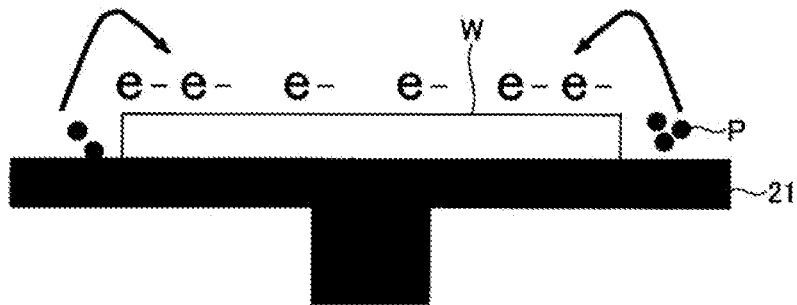

Next, the plasma processing method MT2 according to the second embodiment will be described with reference to FIGS. 7, 8A and 8B. FIG. 7 shows an example of the plasma processing method MT2 according to the second embodiment. FIGS. 8A and 8B explain the plasma processing method MT2 according to the second embodiment. The plasma processing method MT2 is performed by the plasma processing apparatus 1 under the control of the controller 8. The same steps as those of the plasma processing method MT1 according to the first embodiment are assigned the same step numbers. The pre-heating process is executed before the plasma processing method MT2 is started.

When the plasma processing method is started, the steps S1 to S4 are executed, and the microwaves are radiated from all the microwave radiation units 63 until the film formation is completed, thereby performing plasma processing on the substrate W.

When it is determined that the film formation is completed, the application of the RF power for the bias voltage from the RF bias power supply 25 is stopped (step S5). When it is not necessary to attract ions in the plasma toward the substrate W, the application of the RF power in step S2 and the step S5 may be omitted.

Next, the microwave radiation from all the microwave radiation units 63A to 63G is reduced in stages (in a stepwise manner) or continuously (step S11). Then, the microwave radiation from all the microwave radiation units 63A to 63G is stopped (off) (step S12).

In the example of FIG. 8A, in the plasma processing method MT2 of the present embodiment A, the microwave radiation from the microwave radiation units 63A to 63G is controlled to be reduced in two steps and off after the completion of the film formation. In the comparative example B, the microwave radiation from the microwave radiation units 63A to 63G is controlled to be off simultaneously after the completion of the film formation.

After the completion of the film formation, when the microwave radiation is stopped and the plasma 6 disappears, charges are charged on the substrate W to reach a predetermined potential as shown in FIG. 8B. Therefore, after the completion of the film formation, the charged particles P, which are mainly present on the substrate support 21, are attracted onto the substrate W.

As shown in the comparative example B of FIG. 8A, when the microwave radiation from the microwave radiation units 63A to 63G are off simultaneously after the completion of the film formation, the potential difference on the substrate W between the on state and the off state of the microwave radiation from the microwave radiation units 63A to 63G is increased. Accordingly, the number of particles P attracted onto the substrate W by the charges on the substrate W is increased.

On the other hand, in the plasma processing method MT2 of the present embodiment A, the microwave radiation from the microwave radiation units 63A to 63G is reduced in stages and then off after the completion of the film formation. Accordingly, the amount of charges on the substrate W is reduced, so that the attraction of particles P onto the substrate W is suppressed.

According to the test result, the number of particles P on the substrate W is "1073" in the comparative example B, whereas the number of particles P on the substrate W is "25" in the present embodiment A.

This shows that the number of particles on the substrate can be reduced in the case of performing the plasma processing method MT2 according to the second embodiment. Even in the case of continuously reducing the microwave radiation from the microwave radiation units 63A to 63G, similarly to the case of reducing the microwave radiation in stages, the number of particles on the substrate can be reduced.

Before the step S11, the lift pins 19 may be lifted to raise the substrate W from the substrate support 21. By separating the substrate W from the substrate support 21, the falling of the particles P onto the substrate W can be further suppressed, and the number of particles on the substrate can be reduced.

Further, when the film formation is completed, the microwave radiation from the microwave radiation units 63A to 63F except the central microwave radiation unit is reduced in stages or continuously and, then, the microwave radiation from all the microwave radiation units 63A to 63G may be off, for example. In this case as well, it is possible to suppress the attraction of particles P by the charges on the substrate W. In particular, when the microwave output (power) of the outer microwave radiation units 63A to 63F is higher than the microwave output of the central microwave radiation unit 63G, the microwaves of the outer microwave radiation units 63A to 63F may be reduced in stages or continuously.

Further, when the film formation is completed, the microwave radiation from all the microwave radiation units 63A to 63G may be off after the microwave radiation from at least one of the microwave radiation units 63A to 63G is reduced in stages or continuously.

Further, in the plasma processing method MT2, the output of the microwave from the microwave radiation units 63 is controlled in two steps. However, the present disclosure is not limited thereto, and the output of the microwave may be controlled in three or more steps. By controlling the output of the microwave in stages in an optimal number of steps such that the amount of charges on the substrate W is not enough to attract the particles P, the attraction of the particles P onto the substrate W can be effectively reduced.

The plasma processing method MT2 is not necessarily performed by the plasma processing apparatus 1 having configuration shown in FIG. 1, and may be performed by the plasma processing apparatus including only the outer microwave radiation units 63A to 63F without the central microwave radiation unit 63G. Further, the plasma processing method MT2 can also be applied to the plasma processing apparatus 1 including one or more microwave radiation units 63. In that case, the microwave radiation from all or a part of the microwave radiation units 63 of the plasma processing apparatus 1 may be controlled to be reduced in stages or continuously and off.

Third Embodiment

Figure 9:
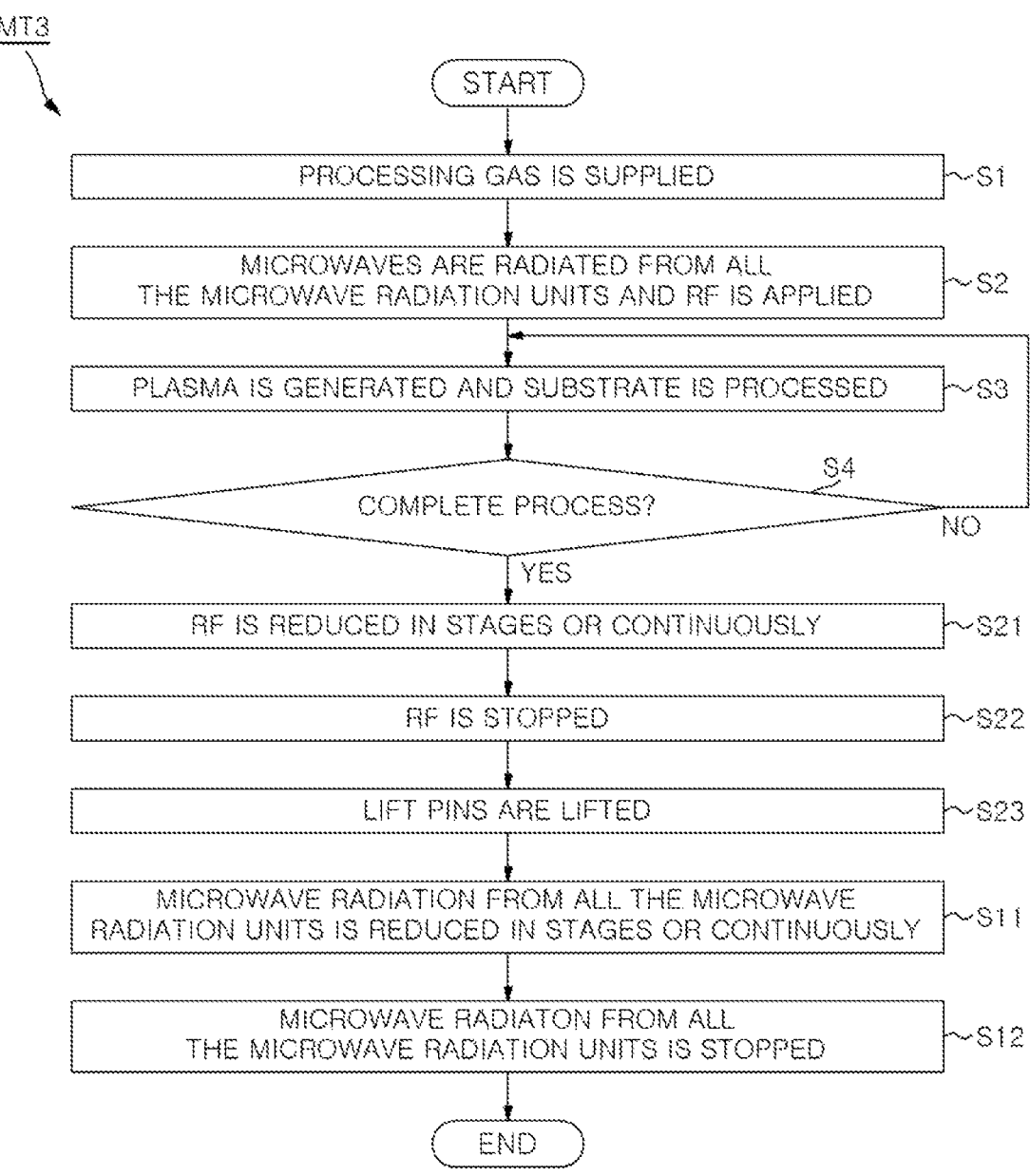
FIG. 9 shows an example of a plasma processing method according to a third embodiment.

Next, the plasma processing method MT3 according to the third embodiment will be described with reference to FIG. 9. FIG. 9 shows an example of the plasma processing method MT3 according to the third embodiment. The plasma processing method MT3 is performed by the plasma processing apparatus 1 under the control of the controller 8. The same steps as those of the plasma processing methods MT1 and MT2 according to the first embodiment and the second embodiment are assigned the same step numbers. Further, the pre-heating process is performed before the plasma processing method MT3 is started.

When the plasma processing method is started, the steps S1 to S4 are executed, and the microwaves are radiated from the microwave radiation unit 63 until the film formation is completed, thereby performing plasma processing on the substrate W.

Next, when it is determined that the film formation is completed, the application of the RF power for the bias voltage from the RF bias power supply 25 is reduced in stages or continuously (step S21). Then, the application of the RF power from the RF bias power supply 25 is stopped (step S22).

Next, the lift pins 19 are lifted to raise the substrate W from the substrate support 21 (step S23). Next, the microwave radiation from all the microwave radiation units 63A to 63G is reduced in stages or continuously (step S11). Next, the microwave radiation from all the microwave radiation units 63A to 63G is stopped (step S12).

In the above-described plasma processing method MT3, in addition to the microwave radiation from the microwave radiation units 63A to 63G, the application of the RF power for the bias voltage from the RF bias power supply 25 is also reduced in stages or continuously. Therefore, the amount of charges on the substrate W is further reduced, and the particles P are less likely to be attracted onto the substrate W. Accordingly, the number of particles P on the substrate W can be further reduced.

In the test result of the plasma processing method MT3, the case of controlling the RF power in stages in the order of 450 W→200 W→0 W, the case of controlling the RF power in stages in the order of 450 W→100 W→0 W, and the case of controlling the RF power in stages in the order of 450 W→50 W→0 W were compared. As a result, in the case of controlling the RF power in stages in the order of 450 W→50 W→0 W, the number of particles P on the substrate W was reduced to 13.

The step S23 of lifting the lift pins 19 may be executed before the step S21. Accordingly, the application of the RF power is reduced in stages or continuously in a state where the substrate W is separated from the substrate support 21, which makes it possible to suppress the particles P on the substrate support 21 from falling onto the substrate W and remaining on the substrate W.

According to the test result obtained when the step 23 of lifting the lift pins 19 was performed before the step S21, the particle reduction effect was obtained in all three patterns in which the RF power was controlled in stages in the order of 450 W→200 W→0 W, in the order of 450 W→100 W→0 W, and in the order of 450 W→50 W→0 W. In other words, in the case of controlling the RF power in stages in the order of 450 W→200 W→W, the number of particles P on the substrate W was reduced to two. In the case of controlling the RF power in stages in the order of 450 W→100 W→0 W, the number of particles P on the substrate W was reduced to five. In the case of controlling the RF power in stages in the order of 450 W→50 W→0 W, the number of particles P on the substrate W was reduced to 11.

From the above, it is clear that the number of particles on the substrate can be reduced in the plasma processing method MT3 according to the third embodiment.

Instead of the steps S11 and S12, steps S6 and S7 shown in FIG. 4 may be executed.

As described above, in the plasma processing method and the plasma processing apparatus according to the first to third embodiments, the number of particles on the substrate W can be reduced.

The plasma processing apparatus and the plasma processing method according to the embodiments of the present disclosure are considered to be illustrative in all respects and not restrictive. The above-described embodiments can be changed and modified in various forms without departing from the scope of the appended claims and the gist thereof. The above-described embodiments may include other configurations without contradicting each other and may be combined without contradicting each other.

For example, the plasma processing method of the present disclosure is not necessarily applied to the plasma processing apparatus for performing film formation, and can be applied to a plasma processing apparatus for performing predetermined processing such as etching, ashing, or the like on a substrate.

While certain embodiments have been described, these embodiments have been presented by way of example only, and are not intended to limit the scope of the disclosures.

Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. A plasma processing method performed by a plasma processing apparatus including a processing chamber having a substrate support on which a substrate is placed, a plurality of microwave radiation units configured to radiate microwaves and including a central microwave radiation unit arranged at a central portion of a ceiling wall of the processing chamber and outer microwave radiation units arranged at an outer peripheral portion of the ceiling wall, and a plurality of gas nozzles arranged at equal intervals in a circumferential direction between the central microwave radiation unit and the outer microwave radiation units, the method comprising:

generating plasma from a processing gas supplied into the processing chamber using the microwaves radiated from the plurality of microwave radiation units and performing plasma processing on the substrate, wherein the plasma processing includes film formation of a film on the substrate;

after the film is formed on the substrate, reducing an application of a radio frequency (RF) bias power by a RF bias power supply to the substrate support in stages or continuously;

stopping the application of the RF bias power from the RF bias power supply to the substrate support after reducing the application of the RF bias power;

after stopping the application of the RF bias power to the substrate support, raising the substrate from the substrate support using lift pins;

after raising the substrate, reducing the microwave radiation only from the outer microwave radiation units in stages or continuously; and after the reduction of the microwave radiation from the outer microwave radiation units is completed, stopping the microwave radiation from the central microwave radiation unit and the outer microwave radiation units.

2. The plasma processing method of claim 1, further comprising:

reducing the application of a RF power in stages or continuously upon completion of the plasma processing of the substrate and, then, completing the application of the RF power.

* * * * *